United States Patent [19]
Zhou et al.

[11] Patent Number: 5,672,969
[45] Date of Patent: Sep. 30, 1997

[54] REDUCTION OF NYQUIST GHOST ARTIFACTS IN OBLIQUE ECHO PLANAR IMAGING

[75] Inventors: Xiaohong Zhou, Franklin; Joseph K. Maier, Milwaukee, both of Wis.; Frederick H. Epstein, Gaithersburg, Md.

[73] Assignee: General Electric Company, Milwaukee, Wis.

[21] Appl. No.: 637,879

[22] Filed: Apr. 25, 1996

[51] Int. Cl.$^6$ .................................................. G01R 33/20
[52] U.S. Cl. ............................................................ 324/309
[58] Field of Search ........................................ 324/307, 309, 324/318, 320, 319, 314, 300, 306; 128/653.2

[56] References Cited

U.S. PATENT DOCUMENTS

| | | | |
|---|---|---|---|
| 5,151,656 | 9/1992 | Maier et al. | 324/309 |
| 5,235,281 | 8/1993 | Haragashira et al. | 324/318 |
| 5,262,725 | 11/1993 | Cuppen et al. | 324/312 |
| 5,270,654 | 12/1993 | Feinberg et al. | 324/309 |
| 5,345,178 | 9/1994 | Manabe et al. | 324/320 |
| 5,391,990 | 2/1995 | Suhmitt et al. | 324/320 |
| 5,539,311 | 7/1996 | Takiguchi | 324/309 |
| 5,570,020 | 10/1996 | Bornert | 324/309 |

*Primary Examiner*—Sandra L. O'Shea
*Assistant Examiner*—Raymond Y. Mah
*Attorney, Agent, or Firm*—James O. Skarsten; John H. Pilarski

[57] ABSTRACT

In a magnetic resonance imaging (MRI) system, a method is provided for reducing oblique Nyquist ghost artifact in an image produced by an oblique EPI scan. Prior to commencing the EPI scan, referencing pre-scans are conducted to generate pre-scan echo trains respectively corresponding to the physical gradient axes. Distortion compensating parameters are derived from the pre-scan echo trains for reducing Nyquist ghost by alternatively modifying the data acquisitions stage of the oblique EPI scan, or the post-data acquisition image processing stage thereof. In one mode of operation, the pre-scan echo trains are generated while a subject is in the MRI system. In another mode of operation, pre-scan echo trains are generated while no subject is present in the MR system, so that the distortion compensating parameters represent characteristics of the MR system only, and thus may be used for EPI scans of different protocols. For such mode of operation the distortion compensating parameters may be computed as a function of readout gradient pulse spacing.

9 Claims, 8 Drawing Sheets

REDUCTION OF NYQUIST GHOST ARTIFACTS IN OBLIQUE ECHO PLANAR IMAGING

BACKGROUND OF THE INVENTION

The invention disclosed and claimed herein generally pertains to a method for reducing artifacts in a magnetic resonance (MR) image acquired by means of a bi-polar readout scan technique such as echo planar imaging (EPI). More particularly, the invention pertains to a method for reducing Nyquist ghost artifacts in an oblique echo planar image.

As is known to those of skill in the magnetic resonance imaging arts, the gradient pulse sequence for an EPI scan comprises a train of gradient pulses of continually alternating polarity in the readout direction, and a train of brief accompanying pulses or "blips" in the phase encoding direction. The EPI scan produces a corresponding train or series of gradient echoes comprising successive MR signals. The echoes are usefully designated as being "odd" or "even" according to their respective positions in the echo train, since odd and even echoes respectively correspond to readout gradients of opposite polarities.

One of the more serious artifacts in echo planar imaging is known as a Nyquist ghost. In the recent past it has been determined that this ghost is caused by inconsistent phase errors between even and odd echoes in the EPI echo train. Two types of phase error have been identified. The first type of phase error, often referred to as the zeroth-order phase errors, is spatially independent. They arise from $B_0$ eddy currents, analog filter phase responses, or other factors that have different effects on odd and even echoes. Since these sources of phase error are, or are assumed to be, spatially independent, the Nyquist ghost caused by the zeroth-order phase errors is not modulated by any spatially variant functions. The second type of phase errors is the so-called linear (or first-order) phase errors. These phase errors related the time shift between respective centers of odd and even echoes, resulting in a Nyquist ghost modulated by a sinusoidal function. In the past, a number of robust methods have been developed to minimize these two types of phase errors, such as the method disclosed in commonly assigned U.S. Pat. No. 5,151,656, issued Sep. 29, 1992 to Maier et al. As a result, ghost-free EPI images have been successfully obtained in a number of clinical protocols.

Recently, there has been a desire to apply EPI scanning to more challenging cardiac imaging protocols. In cardiac imaging, the human heart, due to its orientation, must frequently be imaged in an oblique plane, i.e., a plane that is not parallel to any of the orthogonal axes of the associated MR system. As is known in the art, in a generalized oblique scan the readout, phase encoding, and slice selection gradient fields are synthesized from or mixed among the physical gradients of the MR system, i.e., the $G_x$, $G_y$, and $G_z$ gradients. Thus, each of the oblique or logical gradient, fields may include components of two or three of the physical gradient fields. Such synthesis or mixing produces a unique Nyquist ghost in echo planar imaging, known as Oblique Nyquist Ghost (ONG) that cannot be removed using known ghost-reduction algorithms.

ONG occurs in oblique EPI images when the physical $G_x$, $G_y$, and/or $G_z$ gradients, which collectively produce the EPI readout gradient, do not have the same eddy current behaviors and/or gradient amplifier responses. An example of such non-ideal gradient fidelity is described hereinafter in further detail in connection with FIG. 3 of the drawings. In this example, the EPI readout gradient is collectively produced by two physical gradients $G_x$ and $G_y$ (only two gradients are selected for simplicity; inclusion of the third gradient $G_z$ will not affect the general conclusions on ONG). In the drawing FIG. 3C, the dashed lines represent the ideal gradient waveforms with the phase-encoding blips being intentionally neglected to keep the diagram simple. The solid lines correspond to the actual gradient waveform after the distortion introduced by eddy currents and/or gradient amplifiers. The k-space errors due to gradient distortion are indicated in such figure as $\Delta \vec{k}'_x(i)$ and $\Delta \vec{k}'_y(i)$ for $G_x$ and $G_y$ gradients respectively, where i is the echo index. At the beginning of each echo acquisition, the eddy-current induced and/or amplifier related k-space errors, $\Delta \vec{k}'_x(i)$ and $\Delta \vec{k}'_y$, must be added to the original phase-encoding k-space offset, $\Delta \vec{k}_{pe}$, to give a new "phase-encoding" offset, $\Delta \vec{k}'(i) = \Delta \vec{k}'_x(i) + \Delta \vec{k}'_y(i) + \Delta \vec{k}_{pe}$. Since the signs of $\Delta \vec{k}'_x(i)$ and $\Delta \vec{k}'_y(i)$ alternate between odd and even echoes as indicated in the figure, the odd echoes are shifted along the phase-encoding axis in one direction, and the even echoes are shifted along such axis in the opposite direction. This inconsistency in the k-space shift along the phase-encoding direction, as between respective odd and even echoes, causes the oblique Nyquist Ghost, and, as indicated above, is unique to oblique EPI scans and other bi-polar readout scan techniques.

SUMMARY OF THE INVENTION

The invention is generally directed to a method for eliminating or substantially reducing the foresaid oblique Nyquist ghost artifact from an oblique image produced by an EPI scan technique, by selectively compensating for the effects of distortion in the gradient field waveforms produced by respective physical gradient coils of an associated MR system. Prior to commencing the oblique EPI scan, referencing scans or pre-scans are conducted. For each referencing pre-scan, one of the gradient coils is activated, while the other gradient coils are kept inactive. Respective EPI pre-scans produce corresponding pre-scan echo trains from which distortion compensating parameters can be derived. The oblique EPI scan technique conventionally includes a step of acquiring a series of EPI echoes, and further includes a step of processing the acquired EPI echoes to construct the oblique image. In accordance with the invention, compensating parameters can be derived for use in modifying the oblique scan data acquisition step to substantially reduce artifacts caused by gradient waveform distortion. Alternatively, compensating parameters can be provided to reduce such artifacts by modifying the data processing step.

In one embodiment of the invention, the pre-scans with individual gradient coils are carried out in the presence of a subject which is to be imaged. Accordingly, the compensating parameters will be computed under conditions specifically relating to the subject, and the specified protocol.

In a second embodiment, all of the gradient referencing pre-scans are conducted in the presence of a standard subject, such as a water phantom. For such embodiment, the same set of computed compensating parameters may be used for distortion compensation in imaging different patients or subjects. Accordingly, such embodiment avoids the need to perform referencing pre-scans for each subject, thereby reducing the time which a subject must spend in an MR system. In accordance with such embodiment, the MR system can initially be calibrated by deriving sets of distortion compensating parameters for different time spacings between echoes which are taken over a specified range. For a given imaging protocol with a specific echo time spacing, the corresponding compensating parameters can be obtained from the calibration data by means of interpolation.

This technique covers single and multi-shot EPI irrespective of k-space trajectory or sampling strategy. The technique can also be generalized for any other fast imaging techniques employing bipolar readout gradient which provides a train of successive gradient echoes. The above embodiment directed to modification of data acquisition step may be readily employed for both single- and multi-shot EPI. The embodiment directed to modification of the post acquisition step has been found to be particularly useful in single-shot EPI applications, but is not necessarily limited thereto.

DETAILED DESCRIPTION OF THE PREFERRED EMBODIMENT

Figure 1:
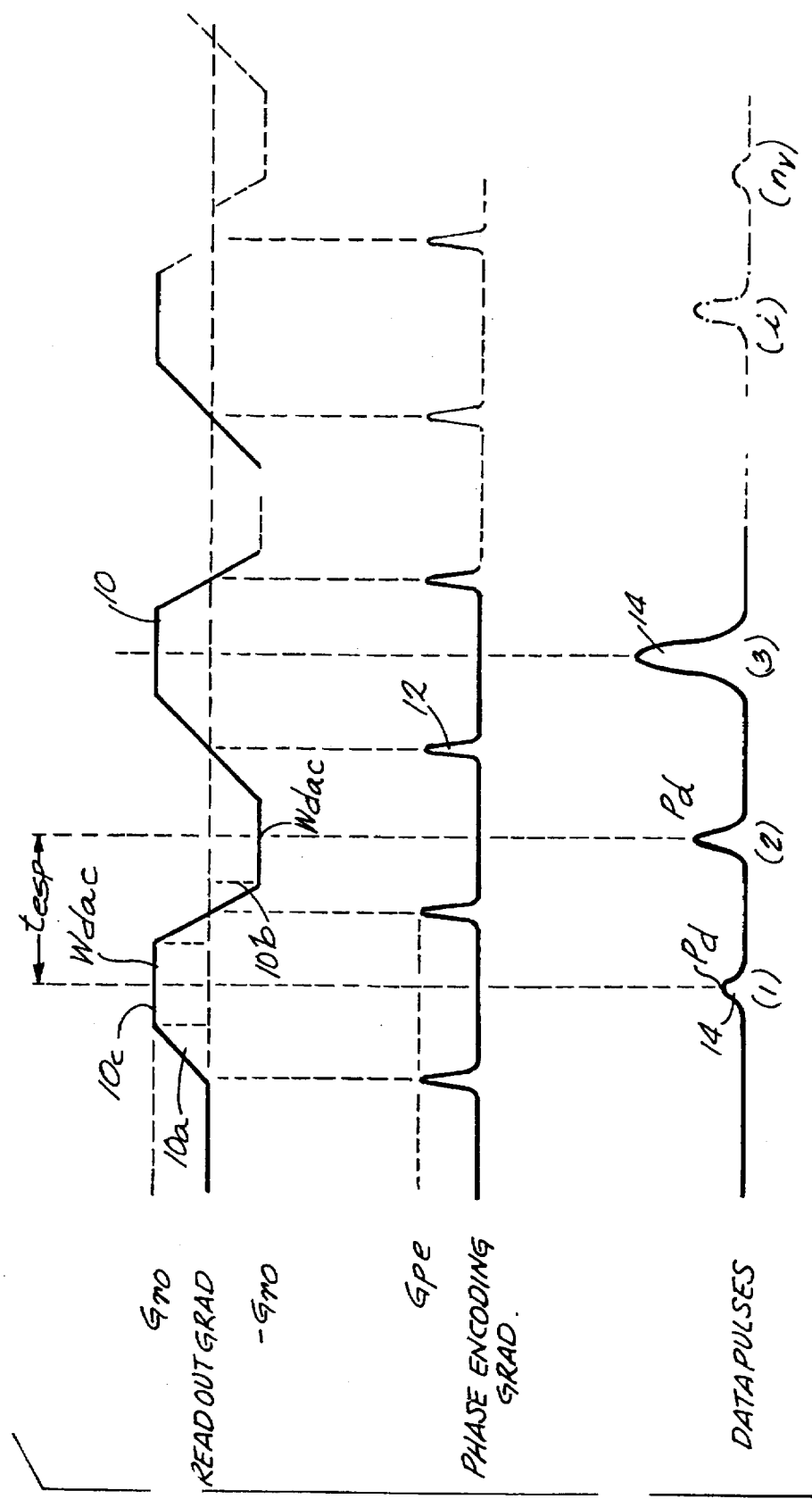
FIG. 1 is a section of a pulse sequence diagram showing a readout gradient waveform, phase encoding gradient waveform, and acquired echoes associated with an EPI scan.
Figure 2:
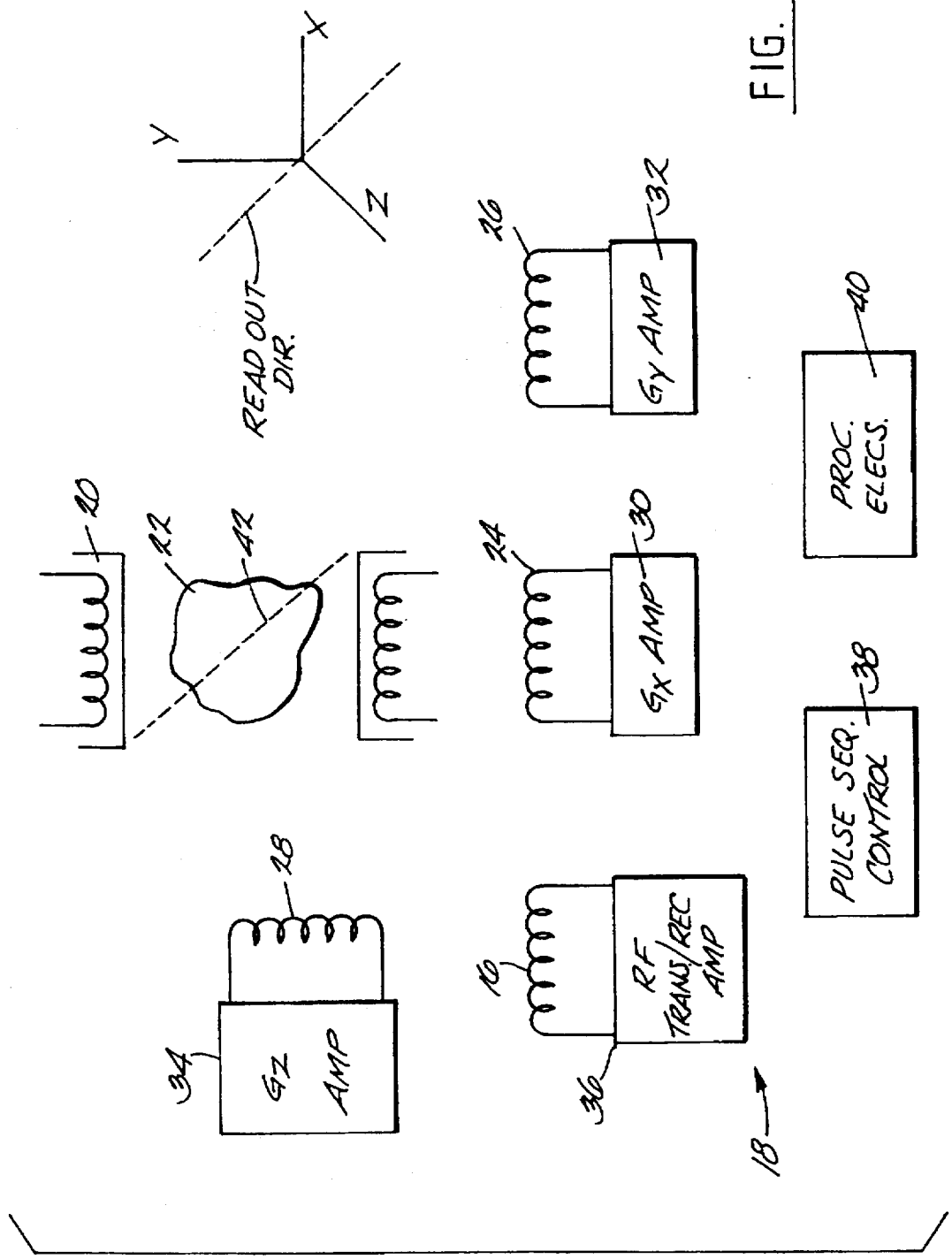
FIG. 2 is a schematic diagram depicting basic components of an MR system implementing an EPI scan, which includes an embodiment of the invention.

Referring to FIG. 1, there are shown readout gradient pulses 10 and phase encoding gradient pulses 12 for the MR scan technique conventionally known as echo-planar imaging or EPI, together with a series of echoes or MR signals 14 generated by the scan. The readout gradient 10 is generally trapezoidal in shape, and alternates between pulses 10a of positive polarity, and pulses 10b of negative polarity. All of the phase encoding pulses 12 within one echo train typically have the same polarity and amplitude $\Delta G_{pe}$, and are of brief time duration. The peak $P_d$ of each echo 14, under ideal conditions, with symmetric $k_x$, coincides in time with the center $W_{dac}$ of a data acquisition window, which is located at the mid-point 10c of successive readout pulses 10a or 10b, in accordance with conventional EPI practice. An RF coil, such as coil 16 shown in FIG. 2, is operated during each data acquisition window to receive or acquire an echo 14, so that information provided thereby can be used to construct an MR image. The time spacing $t_{esp}$ between the centers $W_{dac}$ of adjacent data acquisition windows, and therefore between adjacent echoes 14, is a measure of the width of successive readout pulses 10.

FIG. 1 further shows successive echoes 14 consecutively numbered as (1), (2), (3), ... ,(i), ... (n,) to designate their respective positions in the echo train. Thus, all odd numbered echoes 14 are associated with positive readout pulses such as 10a, and all even echoes 14 are associated with negative readout pulses such as 10b. Such odd-even designation provides a very convenient means for distinguishing between echoes respectively corresponding to positive and negative readout gradient pulses. In another embodiment, odd and even echoes could respectively correspond to negative and positive readout gradients. It is common practice, in EPI single-shot scans, for $n_y$ to range from 64 to 256 echoes.

As is well known by those of skill in the art, a conventional EPI pulse sequence, in addition to the respective pulse sequences shown in FIG. 1, includes a slice selection gradient, possibly one or more RF pulses to generate the echoes 14, and additional pre-phasing gradient pulses in the readout and/or phase encoding directions. Various conventional EPI pulse sequences of such type are taught and disclosed in the prior art in full detail, such as in the aforesaid U.S. Pat. No. 5,151,656, such teachings thereof being incorporated herein by reference.

Referring to FIG. 2, there are shown the basic components of an MR system 18 which may be operated to perform an EPI scan as described herein. System 18, in addition to an RF coil 16, includes a magnet 20 for generating a main or static magnetic field for an imaging subject 22. System 18 further includes gradient coils 24, 26, and 28 for generating $G_x$, $G_y$, and $G_z$ magnetic field gradients relative to the orthogonal X-, Y-, and Z- axes, respectively. FIG. 2 shows each of the gradient coils 24, 26, and 28 respectively driven by amplifiers 30, 32, and 34, which are selectively controlled to regulate time-dependent amplitudes of the respective $G_x$, $G_y$, and $G_z$ gradients. The RF coil 16 is also provided with transmit/receive amplifiers 36. Referring further to FIG. 2, there is shown system 18 provided with a pulse sequence control 38, which is operated to control the operation of the RF and gradient amplifiers, and to thereby generate an EPI pulse sequence to produce and acquire successive echoes 14. System 18 also includes image processing electronics 40 for processing information provided by the acquired echoes 14 to construct an image of a subject 22 taken in an imaging plane 42.

The construction, functions, and interrelationships of the respective components of MR system 18 described above are well known and described in the prior art in full detail, such as in the aforesaid U.S. Pat. No. 5,161,656. Such teachings thereof are incorporated herein by reference.

If the imaging plane 42 is orthogonal to one of the reference axes and parallel to the other two reference axes, the readout, phase encoding, and slice selection gradients will each lie along one of the reference axes, such as along the X-, Y-, Z- axes, respectively. Moreover, for such convention, the $G_x$ gradient field will exclusively comprise the readout gradient $G_{ro}$, $G_y$ will exclusively comprise the phase encoding gradient $G_{pe}$ and $G_z$ will exclusively comprise the slice selection gradient $G_{sl}$. The $G_x$, $G_y$, and $G_z$ gradients are usefully referred to herein as physical gradients, and $G_{ro}$, $G_{pe}$, and $G_{sl}$ are usefully referred to herein as logical gradients. As is well known in the art, if the, imaging plane 42 is in non-parallel and non-orthogonal relationship with two or all three of the reference axes, an image acquired therein is referred to as an oblique image. For an oblique image scan, at least two of the logical gradients are formed from components of two or all three of the physical gradients.

In a generalized oblique scan having an orientation which can be described by a 3×3 rotation matrix R, where R in an orthonormal matrix, the physical gradients $G_x$, $G_y$, and $G_z$ are related to the logical gradients $G_{ro}$, $G_{pe}$, and $G_{sl}$ by:

$$\begin{bmatrix} G_x \\ G_y \\ G_z \end{bmatrix} = R \begin{bmatrix} G_{ro} \\ G_{pe} \\ G_{sl} \end{bmatrix} = \begin{bmatrix} a_{11} & a_{12} & a_{13} \\ a_{21} & a_{22} & a_{23} \\ a_{31} & a_{32} & a_{33} \end{bmatrix} \begin{bmatrix} G_{ro} \\ G_{pe} \\ G_{sl} \end{bmatrix} \quad \text{Equation (1)}$$

The $a_{ij}$ elements comprise rotation matrix elements which are known for a given scan procedure and MR system. It is useful to separate each physical gradient into its three components, i.e., readout, phase-encoding, and slice-selection. For $G_x$, such components are respectively represented as components $G_{x,ro}$, $G_{x,pe}$, and $G_{x,sl}$. Separation of all of the physical gradients may be represented as:

$$\begin{bmatrix} G_{x,ro} & G_{y,ro} & G_{z,ro} \\ G_{x,pe} & G_{y,pe} & G_{z,pe} \\ G_{x,sl} & G_{y,sl} & G_{z,sl} \end{bmatrix} = \begin{bmatrix} a_{11}G_{ro} & a_{21}G_{ro} & a_{31}G_{ro} \\ a_{12}G_{pe} & a_{22}G_{pe} & a_{32}G_{pe} \\ a_{13}G_{sl} & a_{23}G_{sl} & a_{33}G_{sl} \end{bmatrix} \quad \text{Equation (2)}$$

As stated above, the effective $G_{pe}$ gradient waveform is distorted in a manner unique to oblique imaging when the $G_x$, $G_y$, and $G_z$ gradient fields have different eddy current behaviors and/or gradient amplifier responses relative to one another. When this occurs, the ith acquired echo 14 is shifted along the phase encoding direction by $\Delta k'_{pe}(i)$, in addition to its displacement with respect to the readout direction. If there is distortion in each of the three physical readout gradients $G_{x,ro}$, $G_{y,ro}$, and $G_{z,ro}$, the k-space phase shift will comprise three k-space shift components, each representing shift along one of the three reference axes and referred to herein as $\Delta k'_x(i)$, $\Delta k'_y(i)$, and $\Delta k'_z(i)$, respectively. Accordingly, the phase shift $\Delta k'_{pe}(i)$ may be represented as:

$$\Delta k'_{pe}(i) = [a_{12} \quad a_{22} \quad a_{32}] \begin{bmatrix} \Delta k'_x(i) \\ \Delta k'_y(i) \\ \Delta k'_z(i) \end{bmatrix} \quad \text{Equation (3)}$$

FIG. 3 shows the effects of k-space error components $\Delta k_x(i)$ and $\Delta k_y(i)$ for a simplified oblique scan with a rotation angle θ about the z-axis, wherein the imaging plane is normal to the z-axis (i.e., $A_{32}=0$). Referring to FIG. 3A, there are shown the physical $G_x$ and $G_y$ gradient waveforms which, in the absence of distortion, collectively produce the ideal logical readout ($G_{ro}$) and phase-encoding ($G_{pe}$) gradients shown in FIG. 1. FIG. 3B shows the ideal k-space trajectory associated therewith. For such ideal trajectory, the same phase encoding offset $\Delta k_{pe}$ is achieved between each odd and even acquired echo.

Figure 3A:
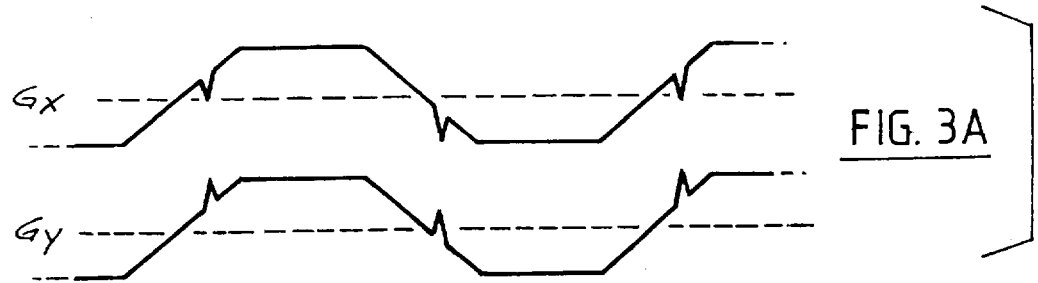
FIGS. 3A–3D are diagrams illustrating respective ideal and distorted $G_x$ and $G_y$ gradient waveforms and their associated k-space trajectories.
Figure 3B:
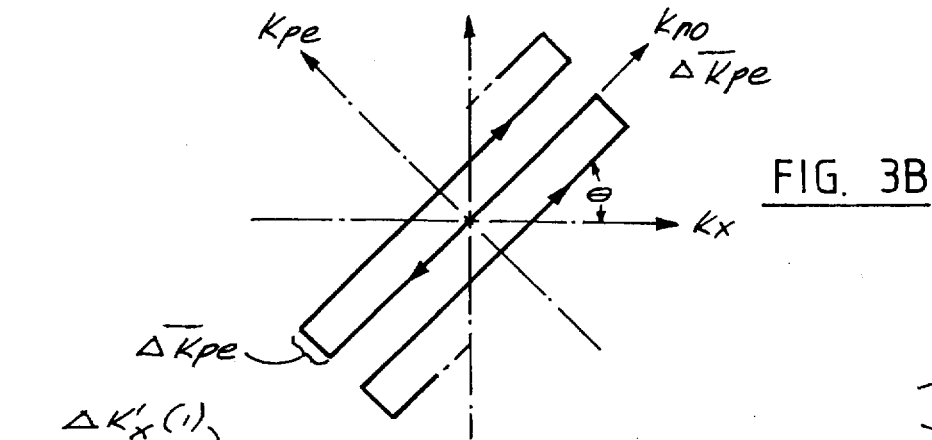
Figure 3C:
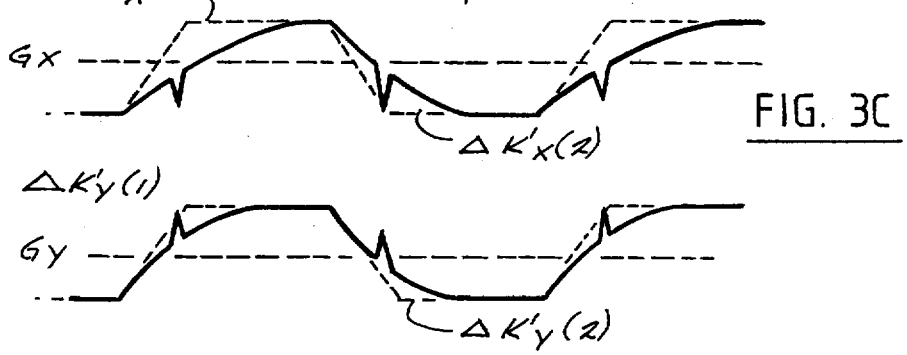

Referring to FIG. 3C, there is shown distortion of the $G_x$ and $G_y$ gradient waveforms, caused, for example, by eddy currents and/or amplifier distortion. FIG. 3C further shows the k-space error components associated with respective gradient waveform distortions.

Figure 3D:
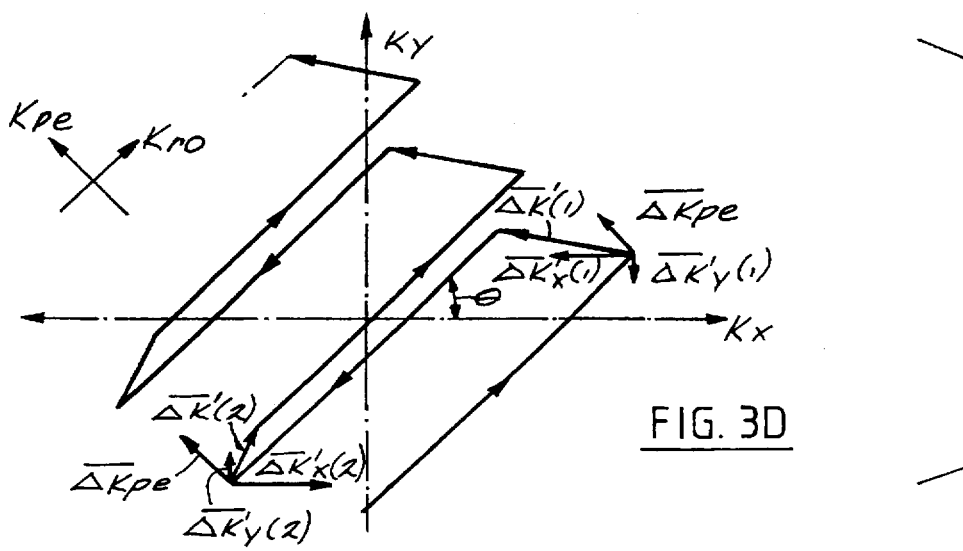

As shown by FIG. 3D, depicting the k-space trajectory corresponding to the gradients of FIG. 3C, the distorted gradient waveforms produce inconsistent k-space data shifts in both readout and phase encoding directions. At the beginning of each acquisition, the eddy-current induced k-space error components $\Delta \vec{k}'_x(i)$ and $\Delta \vec{k}'_y(i)$ must be added to $\Delta \vec{k}_{pe}$, the phase-encoding k-space off-set for the ideal arrangement, to give an overall k-space offset $\Delta \vec{k}'(i)$, that is, $\Delta \vec{k}'(i) = \Delta \vec{k}'_x(i) + \Delta \vec{k}'_y(i) + \Delta \vec{k}_{pe}$. The projection of $\Delta \vec{k}'(i)$ along the phase encoding direction gives the net phase encoding increment $\Delta k'_{pe}(i)$, while the projection along the readout direction corresponds to the k-space error in the readout direction. It is seen from FIG. 3D that the signs of $\Delta \vec{k}_x(i)$ and $\Delta \vec{k}_y(i)$ alternate between odd and even echoes due to the alternating polarity of successive readout gradient pulses, while the polarity of $\Delta \vec{k}_{pe}$ is always the same. Accordingly, the values of $\Delta k'_{pe}(i)$ for odd echoes tend to be very different from $\Delta k'_{pe}(i)$ values for even echoes. The oblique Nyquist ghost arises from this difference.

Figure 4A:
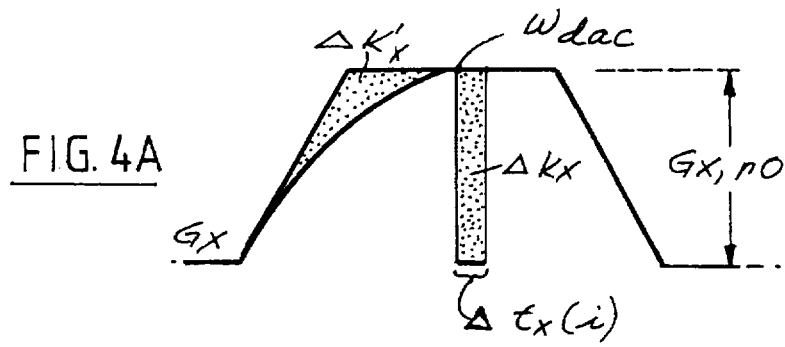
FIGS. 4A–4C are diagrams illustrating k-space errors resulting from waveform distortion of the $G_x$, $G_y$, and $G_z$ gradients, due to eddy currents and gradient non-ideal responses.
Figure 4B:
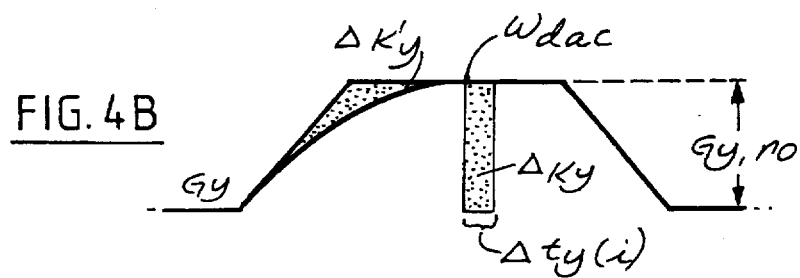
Figure 4C:
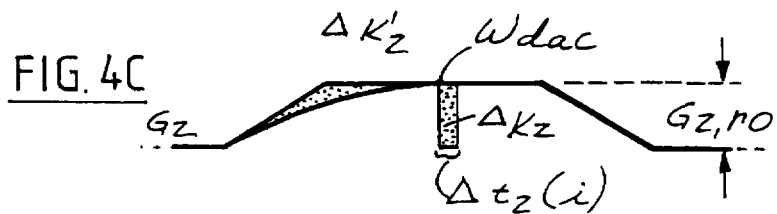

Referring to FIG. 4, the k-space error components $\Delta k'_x(i)$ $\Delta k'_y(i)$ and $\Delta k'_z(i)$ for the general case are respectively illustrated as the shaded areas of FIGS. 4A, 4B and 4C. Referring to FIG. 4A, from phase conservation the shaded area representing $\Delta k'_x(i)$ should be the same as the solid area shown therein as $\Delta k_x(i)$. Assuming that the eddy current is fully decayed near the data acquisition window center $W_{dac}$, the solid area $\Delta k_x(i)$ is given by $\gamma G_{x,ro} \Delta t_x(i)$, where $\Delta t_x(i)$ is the shift in time of the ith echo with the $G_x$ readout gradient. Similarly, $\Delta k'_y(i)$ equals $\Delta k_y(i)$, where $\Delta k_y(i)$ is given by $\gamma G_{y,ro} \Delta t_y(i)$, as shown by FIG. 4B, and $\Delta k'_z(i)$ equals $\Delta k_z(i)$, where $\Delta k_z(i)$ is given by $\gamma G_{z,ro} \Delta t_z(i)$, as shown by FIG. 4C. Such relationships are usefully represented as follows:

$$\begin{bmatrix} \Delta k'_x(i) \\ \Delta k'_y(i) \\ \Delta k'_z(i) \end{bmatrix} = \begin{bmatrix} \Delta k_x(i) \\ \Delta k_y(i) \\ \Delta k_z(i) \end{bmatrix} = \gamma \begin{bmatrix} G_{x,ro} \Delta t_x(i) \\ G_{y,ro} \Delta t_y(i) \\ G_{z,ro} \Delta t_z(i) \end{bmatrix} \quad \text{Equation (4)}$$

Combining Equations (2), (3), and (4) provides the following expression for $\Delta k'_{pe}(i)$:

$$\Delta k'_{pe}(i) = \gamma G_{ro}[a_{11}a_{12}\Delta t_x(i) + a_{21}a_{22}\Delta t_y(i) + a_{31}a_{32}\Delta t_z(i)] \quad \text{Equation (5)}$$

As stated above, the rotation matrix elements $a_{ij}$ are known. $G_{ro}$, the amplitude of the readout gradient, i.e., the flat-topped value of the logical readout gradient as shown in FIG. 1, is also known. Accordingly, the phase-encoding error $\Delta k'_{pe}(i)$ can be readily determined from the time shifts $\Delta t_x(i)$, $\Delta t_y(i)$ and $\Delta t_z(i)$. These time shifts are in turn determined in accordance with the invention, by conducting several EPI referencing pre-scans, as described hereinafter in connection with FIG. 6, each pre-scan exclusively employing a different one of the gradient coils.

Since the phase encoding error of the ith echo may be computed as a function of the time shifts, with respect to the three reference axes, a phase correction or compensation parameter may be provided for such ith echo which is likewise a function of the three time shifts. More particularly, in accordance with the invention it has been found that $\Delta k'_{pe}(i)$ can be compensated or corrected by selectively adjusting the amplitude of the oblique EPI scan phase encoding gradient, prior to acquisition of the ith echo. If the nominal amplitude of the phase encoding gradient is $\Delta G_{pe}$, the gradient compensating or correction parameter $\Delta G'_{pe}(i)$, for the ith echo is given by the following expression:

$$\Delta G'_{pe}(i) = \frac{\gamma G_{ro} \Delta G_{pe} L_{pe}}{N_{shot}} [a_{11}a_{12}\Delta t_x(i) + a_{21}a_{22}\Delta t_y i + a_{31}a_{32}\Delta t_z(i)]$$  Equation (6)

Figure 5:
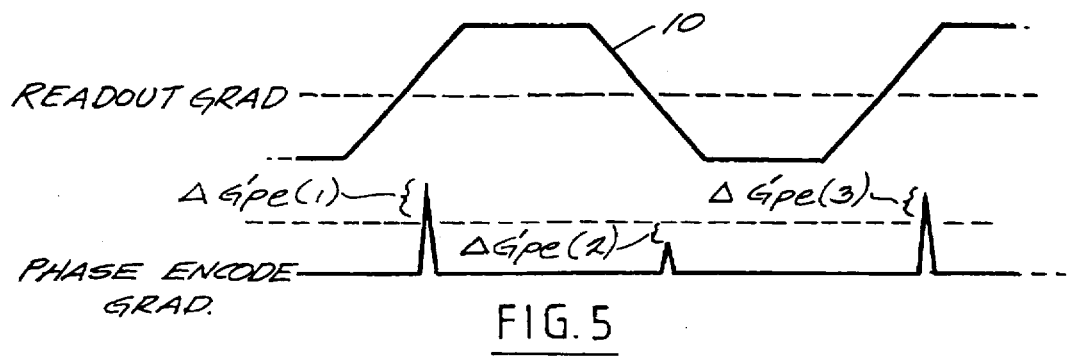
FIG. 5 is a pulse sequence diagram illustrating correction of phase error during the data acquisition step of an oblique EPI scan.

In Equation (6), $N_{shot}$ is the number of shots in the EPI pulse sequence, and $L_{pe}$ is the field of view in the phase-encoding direction. This equation can be directly derived from equation (5) using the following two relationships:

$$\Delta k'_{pe} i = \gamma \Delta G'_{pe}(i) \int_0^{t_{pe}} \lambda(t) dt, \text{ and}$$

$$\Delta k_{pe} = \gamma \Delta G_{pe}(i) \int_0^{t_{pe}} \lambda(t) dt = N_{shot}/L_{pe},$$

where $\lambda(t)$ represents the dimensionless phase-encoding waveform, and $t_{pe}$ is the total phase-encoding time. To compensate for or prevent k-space shift along the phase-encoding direction, the phase encoding gradient for the ith echo comprises $\Delta G_{pe}(i) + \Delta G_{pe}$. FIG. 5 shows the phase-encoding gradient varied by $\Delta G'_{pe}(1)$, $\Delta G'_{pe}(2)$, and $\Delta G'_{pe}(3)$ for acquisition of the first, second and third echoes respectively.

To determine the time shift $\Delta t_x(i)$ for a subject 22, the subject is positioned with respect to an MR system 18. A referencing pre-scan procedure is then conducted which comprises a conventional EPI scan technique, with the logical readout gradient $G_{ro}$ playing solely on physical gradient $G_x$. The Y- and Z- gradient coils are kept inactive and no logical phase-encoding gradient is applied. Accordingly, a series of $n_y$ reference echoes are readout along the $k_x$-axis.

Figure 6:
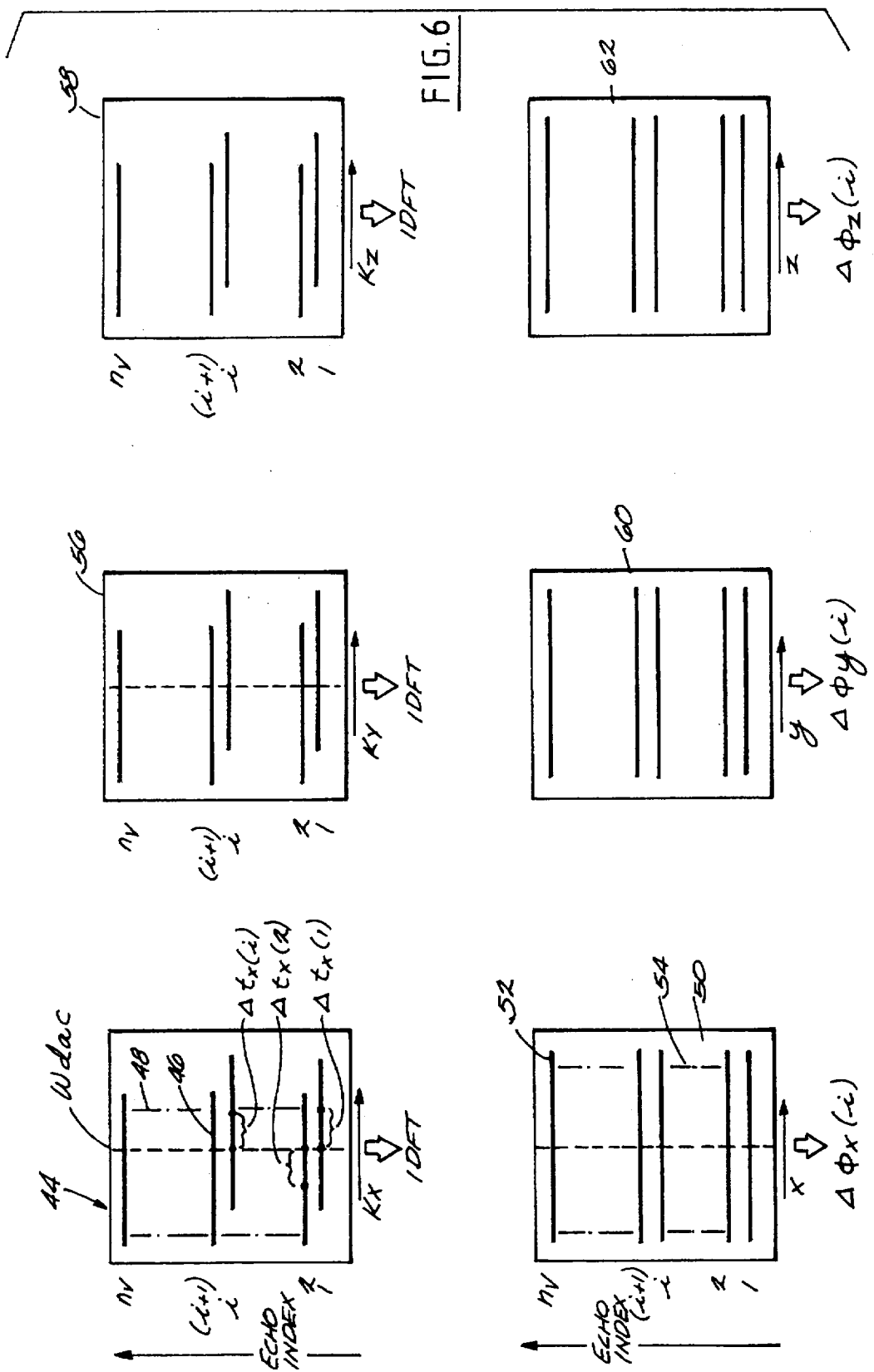
FIG. 6 is a diagram depicting the processing of sets of reference data acquired from pre-scans respectively employing individual gradient coils.

Referring to FIG. 6, there is shown a matrix array 44 which represents data acquired from the $n_y$ reference echoes. Each row 46 of the array 44 corresponds to the ith reference echo, and respective data points along the row 46 are provided by sampling the ith reference echo at a certain rate. The time shift $\Delta t_x(1)$ is depicted in array 44 as an offset between the center of the first echo and the center of the data acquisition window $W_{dac}$. More generally, the time shift $\Delta t_x(i)$ is depicted as an offset between the ith echo or the ith row and its corresponding center of the acquisition window. This time shift generally is too short to measure directly.

Referring further to FIG. 6, there is shown a one dimensional Fourier transform applied to data of respective rows of matrix array 44 to generate a second matrix array 50. The ith row 52 of the array 50 also corresponds to the ith reference echo of the pre-scan directed to the X-gradient coil. In the event of a time shift $\Delta t_x(i)$ resulting from distortion in the gradient waveform produced by the X-gradient coil, such as may be due to eddy currents or a non-ideal response of the gradient amplifier 30 a linear phase slope occurs in each row i of matrix array 50 which corresponds to the time shift $\Delta t_x(i)$. This linear phase is represented by $\Delta \phi_x(i)$. More specifically, $\Delta \phi_x(i)$ is the phase slope or linear phase shift across respective data elements in the image domain in the ith row 52 of array 50, wherein the linear change results from waveform distortion. Thus, by processing data in matrix array 50, the linear phase shift $\Delta \phi_x(i)$ can be computed for each of the $n_y$ reference projections acquired by the pre-scan operation of the X-gradient coil.

Following the X-gradient coil pre-scan, similar referencing pre-scans are carried out by activating the Y-gradient coil while the X- and Z- gradient coils are kept inactive, and the Z-axis coil is activated while the X- and Y- gradient coils are kept inactive. The pre-scan operations directed to the Y- and Z- gradient coils respectively produce matrix arrays 56 and 58. One-dimensional Fourier transforms are applied to the rows of matrix arrays 56 and 58 to respectively produce matrix arrays 60 and 62, the readout directions thereof respectively being along the Y- and Z- axes. Linear phase shifts $\Delta \phi_y(i)$ and $\Delta \phi_z(i)$, respectively representing distortion of the Y- and Z- gradient fields, are computed from matrix arrays 60 and 62.

After each of the linear phase shifts has been computed, the time shifts $\Delta t_x(i)$, $\Delta t_y(i)$, and $\Delta t_z(i)$ can be determined from the following relationship:

$$\begin{bmatrix} \Delta t_x(i) \\ \Delta t_y(i) \\ \Delta t_z(i) \end{bmatrix} = \frac{N_{ro} t_{sp}}{2\pi} \begin{bmatrix} \Delta \phi_x(i) \\ \Delta \phi_y(i) \\ \Delta \phi_z(i) \end{bmatrix}$$  Equation (7)

where $N_{ro}$ is the number of data points used in the Fournier transform, and $t_{sp}$ is the dwell time.

In a second embodiment of the invention, the linear phase shifts respectively representing time shifts $\Delta t_x(i)$, $\Delta t_y(i)$, and $\Delta t_z(i)$, are used to compute distortion compensating parameters which are applied to modify the data processing stage of the oblique EPI scan procedure, rather than the data acquisition stage. For such method, it is assumed that the k-space shift has the same value $\Delta k'_{pe,o}$ for all odd echoes. It is likewise assumed that k-space phase shift has the same value $\Delta k'_{pe,e}$ for all even echoes. It is further assumed that the entire k-space data are acquired in a single shot.

Figure 7:
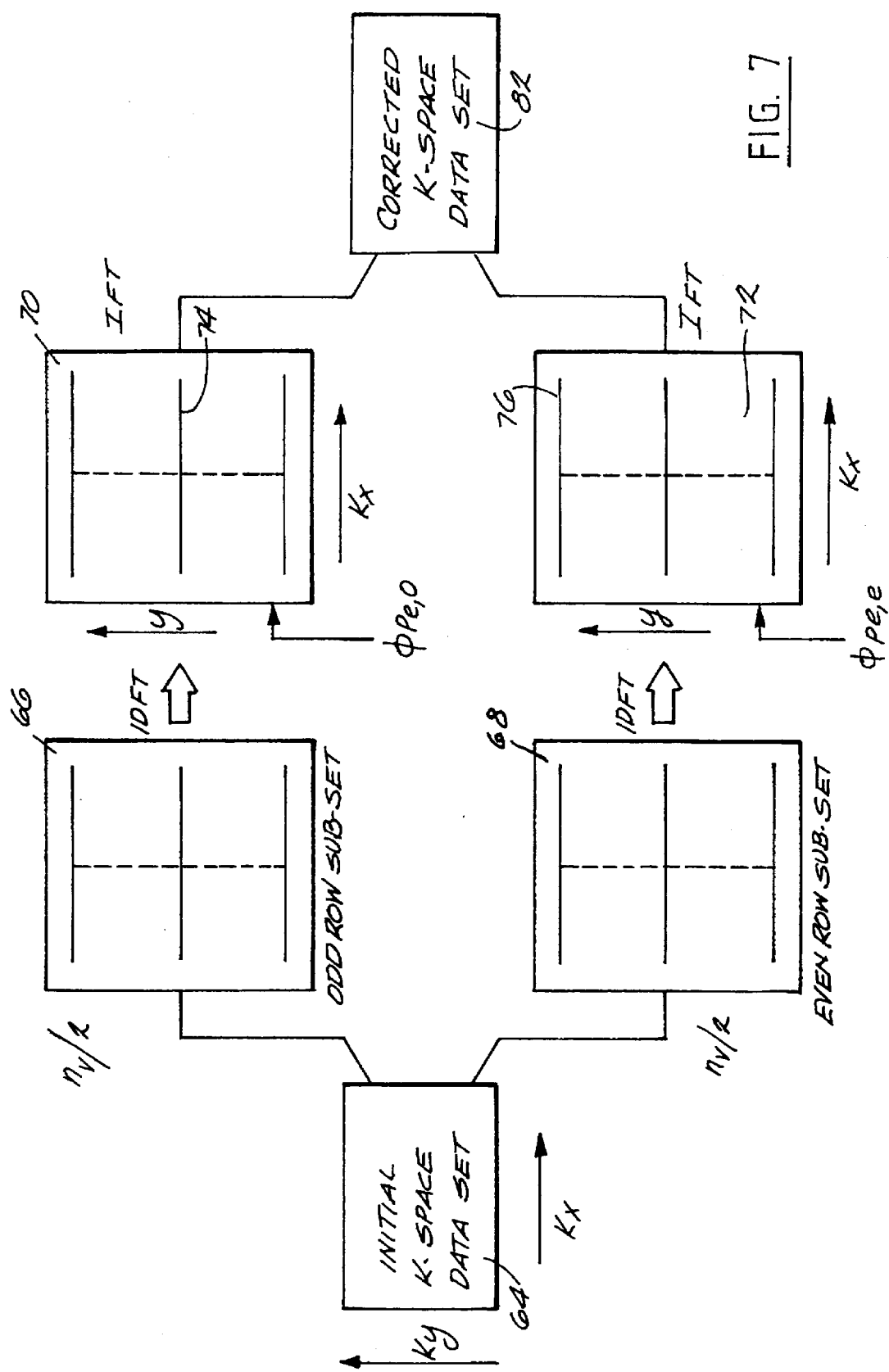
FIG. 7 is a diagram illustrating correction of phase error during the data processing step of an oblique EPI scan.

In accordance with the second embodiment, the respective echoes, acquired during the data acquisition step of an oblique EPI scan, are processed in accordance with conventional EPI post acquisition processing techniques. A full set or array of k-space data, such as array 64 shown in FIG. 7, is generated thereby wherein $k_x$ is the readout direction and $k_y$ is the phase-encoding direction. Thus, matrix array 64 comprises $n_y$ rows, each associated with one of the phase-encoded echoes. Generation of array 64 may include correction of certain readout errors, by means of methods now known in the art such as techniques set forth in the aforesaid U.S. Pat. No. 5,515,656. However, phase encoding k-space errors $\Delta k'_{pe}$, the source of the oblique Nyquist ghost as described above, are not corrected for data elements of matrix array 64. Referring further to FIG. 7, there are shown k-space data subsets 66 and 68, each having $n_y/2$ rows or lines in the phase encoding direction. Subsets 66 and 68 are respectively generated by dividing the k-space data of array 64 into the odd echo set and the even echo set, respectively. Accordingly, the k-space shift of each line of data in subset 66 will be $\Delta k'_{pe,o}$ given the assumption described above. Similarly, the k-space shift in each line of data in subset 68 will be $\Delta k'_{pe,e}$.

FIG. 7 further shows a one dimensional Fourier transform applied to each of the subsets 66 and 68 along the phase encoding direction, to provide hybrid-space odd and even subsets 70 and 72, respectively. Thus lines 74 of subset 70, represented in the Fourier domain, are each shifted by a linear phase angle corresponding to k-space shift $\Delta k'_{pe,o}$. Therefore, a compensating linear phase shift $\phi_{pe,o}$, computed as described hereinafter, is applied to shift each of the lines 74 of subset 70 back to its correct position, i.e., its position in the absence of phase shift $\Delta k'_{pe,o}$. In like manner, a compensating linear phase shift $\phi_{pe,e}$, likewise computed as described hereinafter, is applied to shift respective lines 76 of even subset 72 to cancel effects of phase shift $\Delta k'_{pe,e}$.

After linear phase correction of subsets 70 and 72, one dimensional inverse Fourier transforms are applied thereto to generate corrected k-space subsets 70 and 72, respectively. Subsets 70 and 72 are combined to form a corrected full k-space data set 82, which is processed in accordance with conventional practice to provide the desired oblique image.

The phase shift corrections $\phi_{pe,o}$ and $\phi_{pe,e}$ can be computed from the following relationships:

$$\phi_{pe,o} = \frac{L_{pe} N_{ro}}{L_{ro} N_{pe}} [a_{11}a_{12}\Delta\phi_{x,o} + a_{21}a_{22}\Delta\phi_{y,o} + a_{31}a_{32}\Delta\phi_{z,o}] \quad \text{Equation (8)}$$

$$\phi_{pe,e} = \frac{L_{pe} N_{ro}}{L_{ro} N_{pe}} [a_{11}a_{12}\Delta\phi_{x,e} + a_{21}a_{22}\Delta\phi_{y,e} + a_{31}a_{32}\Delta\phi_{z,e}] \quad \text{Equation (9)}$$

For the above Equations (8) and (9), $N_{pe}$ is the number of rows in each of the arrays 70 and 72, and is therefore equal to $n_y/2$. $N_{ro}$ is equal to the number of data elements along each of the rows 74 and 76 of the respective arrays 70 and 72. The phase shift $\Delta\phi_{x,o}$ is obtained from the following equation:

$$\Delta\phi_{x,o} = a_{x,o}m + b_{x,o} \quad \text{Equation (10)}$$

where m is the $k_y$ index at the center of the k-space, and $a_{x,o}$ and $b_{x,o}$ are the slope and the intercept, respectively, of the linear least-square fitting between $\Delta\phi_{x,o}(i_o)$ and the odd echo index $i_o$. Similarly, $\Delta\phi_{y,o} = a_{y,o}m + b_{y,o}$, and $\Delta\phi_{z,o} = m + b_{z,o}$ with $a_{y,o}$, $b_{y,o}$, and $a_{z,o}$, $b_{z,o}$ obtained from the corresponding linear least-square fitting for the other two gradient axes y and z. In a similar manner, we have $\Delta\phi_{x,e} = a_{x,e}n + b_{x,e}$, $\Delta\phi_{y,e} = a_{y,e}n + b_{y,e}$, and $\Delta\phi_{z,e} = a_{z,e}n + b_{z,e}$ for the even echoes, where n is the $k_y$ index corresponding to the center of the k-space.

In a further modification of the invention, the MR system 18 is operated to perform referencing pre-scans as described above in connection with FIG. 6 to compute time shift values $\Delta t_x(i), \Delta t_y(i)$ and $\Delta t_z(i)$, for each value of i. However, the pre-scans are conducted while a calibration phantom, rather than a patient, is present in the MR system. Since the calibration procedure is designed to cover a range of frequently encountered protocols, the time shift values thus obtained comprise reasonable approximations for computing distortion compensating parameters for any patient generally, in accordance with both the pre-data acquisition technique described above in connection with FIGS. 5, and the post acquisition technique described in connection with FIG. 7. At the same time, total imaging time required for a given patient is significantly reduced, since the patient-specific referencing pre-scans are eliminated.

Figure 8A:
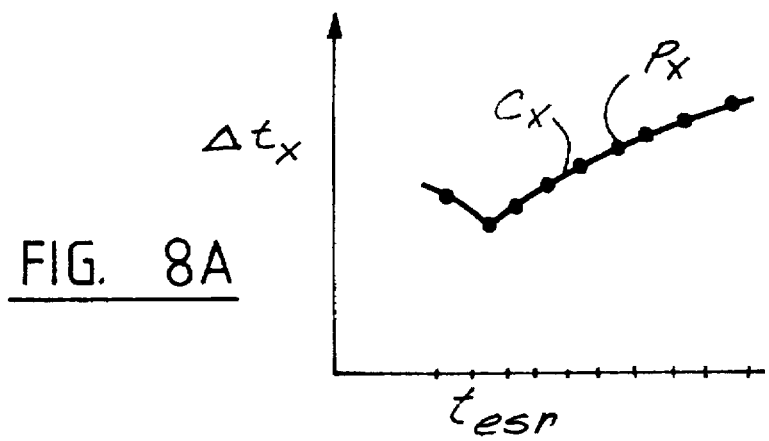
FIGS. 8A–8C are graphs showing time shift along the X-axis as a function of the time spacing between acquired EPI referencing echoes.

Usefully, values of $\Delta t_x(i)$, $\Delta t_y(i)$, and $\Delta t_z(i)$ are determined for different echo time spacings $t_{esp}$. For example, the respective values of $\Delta t_x(i)$ time shift may be computed, from repeated referencing pre-scans and Equation (7), for eight different values of $t_{esp}$, varying over the range from 600 microseconds to 2200 microseconds. Referring to FIG. 8A, there is shown a plot of $t_{esp}$ versus $\Delta t_x(i)$ representing data points $P_x$ acquired thereby for the ith echo. A curve $C_x$ may be fitted thereto, and the value of $\Delta t_x(i)$, may be determined for any value of $t_{esp}$ within the specified range. Alternatively, the value of $\Delta t_x(i)$ corresponding to a specific $t_{esp}$ can be obtained by linear or polynomial interpolation.

Figure 8B:
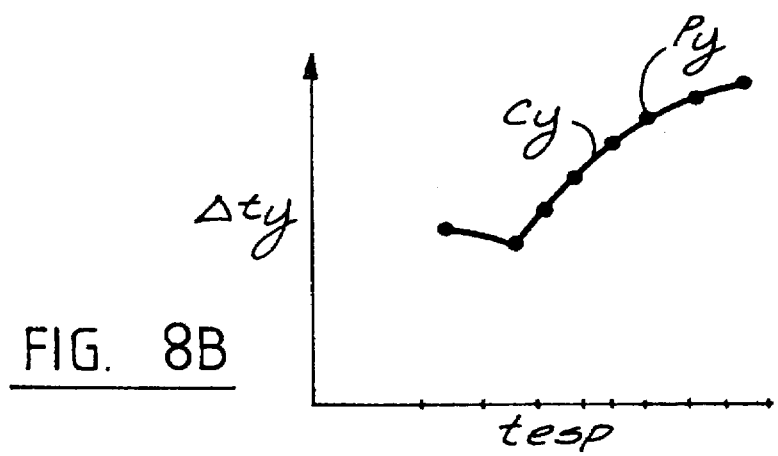
Figure 8C:
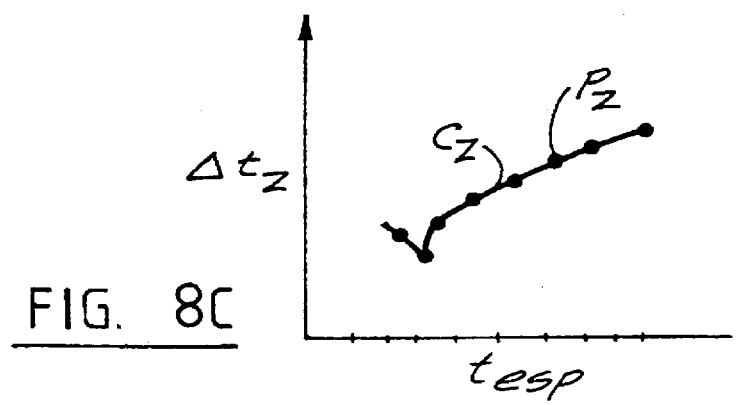

Similarly, as respectively shown by FIGS. 8B and 8C, values of $\Delta t_y(i)$ and $\Delta t_z(i)$ can be computed for the same values of $t_{esp}$, and over the same range thereof. FIG. 8B shows acquired data points $P_y$ and curve $C_y$ fitted thereto and FIG. 8C shows acquired data points $P_z$ and curve $C_z$ fitted thereto.

In one mode, an MR system 18 is calibrated shortly after its initial construction for respective time shift values $\Delta t_x(i)$, $\Delta t_y(i)$, and $\Delta t_z(i)$, for varying values of $t_{esp}$. All of the time shift values are stored in a table incorporated into the MR system. In a subsequent oblique EPI scan, the respective time shift values corresponding to a particular value of $t_{esp}$ to be used in the scan can then be simply selected or interpolated from the table for use in distortion compensation to reduce the Nyquist ghost artifact, using either of the correction alternatives described above. Thus, to correct for gradient distortion prior to acquisition of the ith echo, the selected values of $\Delta t_x(i)$, $\Delta t_y(i)$, and $\Delta t_z(i)$ from the table are inserted into Equation (6) to find the phase encoding gradient compensation parameter, as described above.

Figure 9:
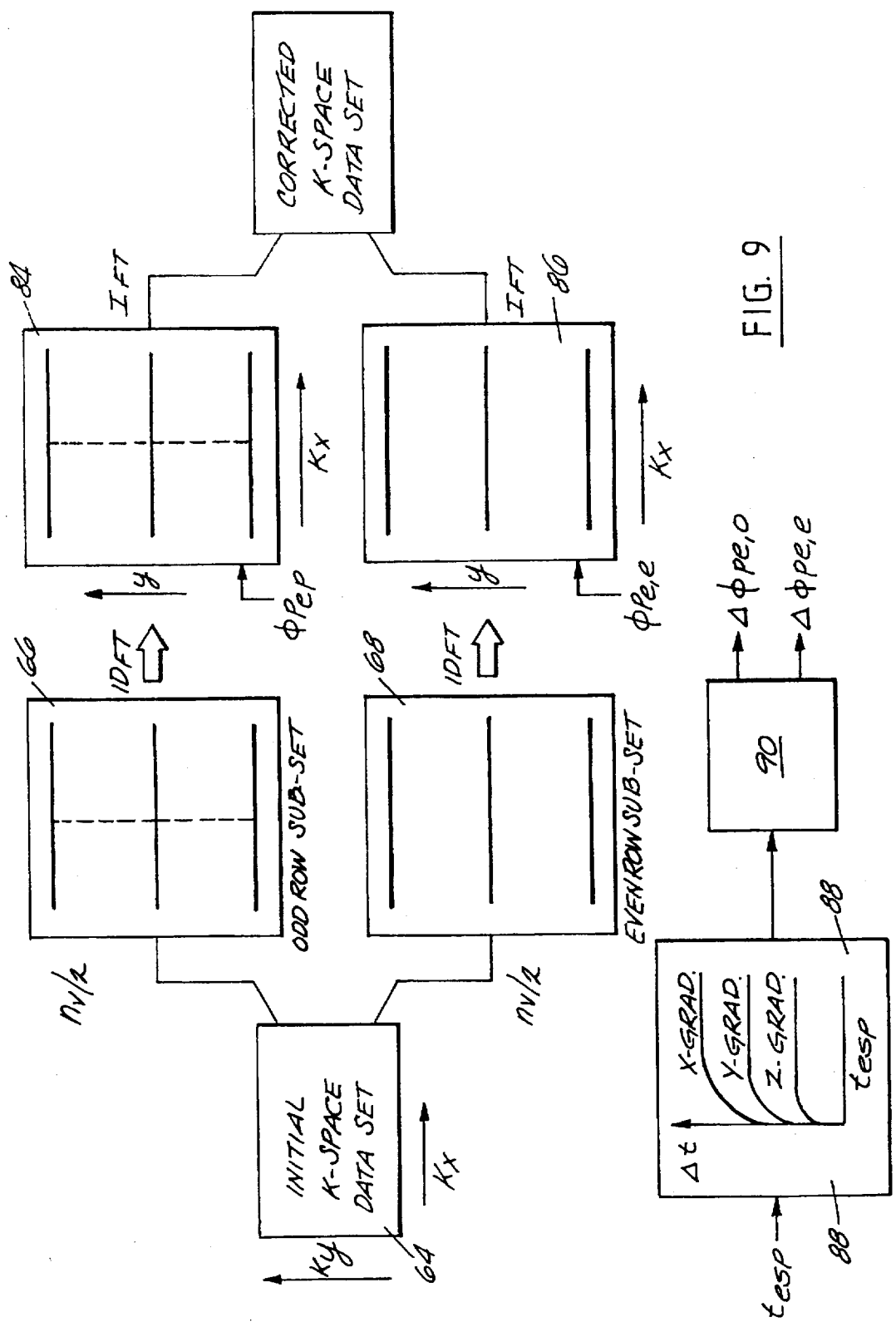
FIG. 9 is a diagram illustrating an embodiment of the invention which eliminates reference pre-scans of individual subject.

Referring to FIG. 9, there is shown a diagram, very similar to FIG. 7, illustrating use of the pre-determined time shift values from the table to provide distortion compensation during the post data acquisition stage. Thus, matrix array 64 and subsets 66 and 68 are as respectively described above in connection with FIG. 7. One dimensional Fourier transforms are applied to the subsets 66 and 68, as described therein, to provide hybrid-space odd and even subsets 84 and 86, respectively. However, to compute the linear phase shifts $\phi_{pe,o}$ and $\phi_{pe,e}$ for phase shift corrections, for a given value of $t_{esp}$, the corresponding values of $\Delta t_x$, $\Delta t_y$, and $\Delta t_z$ are selected from table 88 and coupled to processing block 90. Phase shifts $\phi_{pe,o}$ and $\phi_{pe,e}$ are then computed therefrom in accordance with Equations (7), (8) and (9) and the procedures described above in regard to FIG. 7.

Obviously, many other modifications and variations of the present invention are possible in light of the above teachings. It is therefore to be understood that within the scope of the disclosed concept, the invention may be practiced otherwise than as specifically described.

What is claimed is:

1. In an MR system having a plurality of gradient coils and operated in accordance with an EPI scan technique to provide an oblique image of a subject, wherein said scan technique includes the steps of acquiring a series of EPI echoes, and then processing said acquired echoes to provide said oblique image, and wherein gradient waveforms respectively produced by said gradient coils can be distorted differently from one another, an artifact correction method comprising:

executing gradient referencing pre-scans to generate trains of reference echoes, each of said trains of reference echoes generated in accordance with an EPI sequence while a corresponding one of said gradient coils is activated for readout only and the remaining coils are inactivated;

selectively processing said reference echoes to derive a set of distortion compensating parameters associated with a selected one of said steps of said EPI scan technique; and modifying said selected step of said EPI scan technique in accordance with said compensating parameters to significantly reduce oblique Nyquist ghost artifacts in said oblique image.

2. The method of claim 1 wherein:

the reference echoes of the reference echo train corresponding to a particular one of said gradient coils are respectively shifted in time, with respect to an associated data acquisition window, along an axis corresponding to said particular gradient coil;

said method includes a step of computing time shift elements from said reference echo trains, each of said time shift elements representing the said shift in time of a corresponding one of said reference echoes; and said distortion compensation parameters are computed from said time shift elements.

3. The method of claim 2 wherein:

said referencing pre-scans comprise sequentially activating each of said gradient coils to project its corresponding gradient field into a volume containing the structure through which said oblique image is to be taken.

4. The method of claim 3 wherein:

said selected step of said EPI scan technique comprises said echo acquisition step, the acquisition of each echo having an associated nominal phase encoding gradient amplitude;

each of said distortion compensation parameters comprises a gradient correction value; and said modifying step comprises adjusting each of said nominal phase encoding gradient amplitudes by one of said amplitude correction values.

5. The method of claim 3 wherein:

said selected step of said EPI scan technique comprises said echo processing step, said acquired echoes being alternately designated as being odd or even according to their respective positions in said series, and an initial k-space data set being formed from data collectively provided by said odd and even acquired echoes;

each reference echo of each of said reference echo trains corresponds to one of said acquired echoes and is designated as odd or even, according to the designation of its corresponding echo;

said compensating parameters comprise respective odd and even compensating linear phase shifts, said odd compensating phase shift computed from time shift elements corresponding to said odd echoes and said even phase shift computed from time shift elements corresponding to said even echoes;

said initial k-space data set is divided into respective odd and even k-space subsets;

a one-dimensional Fourier transform is performed along the phase encoding direction of both said odd and even subsets to provide respective transformed odd and even subsets;

said odd and even compensating linear phase shifts are respectively applied to said transformed odd and even subsets to respectively provide odd and even corrected subsets; and an inverse Fourier transform is applied to each of said adjusted subsets to provide odd and even inversely transformed subsets, said inversely transformed subsets being combined into a compensated set of k-space data.

6. The method of claim 2 wherein:

said referencing pre-scan comprises sequentially activating each of said gradient coils to project its corresponding gradient field into a phantom, the waveforms of said projected fields being substantially affected only by distortion parameters produced by structure of said MR system.

7. The method of claim 6 wherein:

said EPI scan technique includes generating a series of readout gradient pulses of variable inter-pulse time spacing; and one of said gradient referencing pre-scans is executed for each value of said gradient pulse spacing selected from a specified range.

8. The method of claim 6 wherein:

said selected step of said EPI scan technique comprises said echo acquisition step, the acquisition of each echo having an associated nominal phase encoding gradient amplitude;

each of said distortion compensation parameters comprises a gradient correction value; and said modifying step comprises adjusting each of said nominal phase encoding gradient amplitudes by one of said amplitude correction values.

9. The method of claim 6 wherein:

said selected step of said EPI scan technique comprises said echo processing step, said acquired echoes being alternately designated as being odd or even according to their respective positions in said series, and an initial k-space data set being formed from data collectively provided by said odd and even acquired echoes;

each reference pulse of each of said reference pulse trains corresponds to one of said acquired echoes, and is designated as odd or even, according to the designation of its corresponding echoes;

said compensating parameters comprise respective odd and even compensating linear phase shifts, said odd compensating phase shift computed from time shift elements corresponding to said odd data pulses and said even phase shift computed from time shift elements corresponding to said even echoes;

said initial k-space data set is divided into respective odd and even k-space subsets;

a one-dimensional Fourier transform is performed along the phase encoding direction of both said odd and even subsets to provide respective transformed odd and even subsets;

said odd and even compensating linear phase shifts are respectively applied to said transformed odd and even subsets to respectively provide odd and even corrected subsets; and an inverse Fourier transform is applied to each of said adjusted subsets to provide odd and even inversely transformed subsets, said inversely transformed subsets being combined into a compensated set of k-space data.

* * * * *